(12) United States Patent
Jacobsen et al.

(10) Patent No.: US 6,850,312 B2
(45) Date of Patent: Feb. 1, 2005

(54) APPARATUSES AND METHODS FOR FLEXIBLE DISPLAYS

(75) Inventors: Jeffrey Jay Jacobsen, Hollister, CA (US); John Stephen Smith, Berkeley, CA (US); Mark A. Hadley, Newark, CA (US)

(73) Assignee: Alien Technology Corporation, Morgan Hill, CA (US)

( * ) Notice: Subject to any disclaimer, the term of this patent is extended or adjusted under 35 U.S.C. 154(b) by 0 days.

(21) Appl. No.: 10/812,788

(22) Filed: Mar. 29, 2004

(65) Prior Publication Data

US 2004/0179145 A1 Sep. 16, 2004

Related U.S. Application Data

(60) Continuation of application No. 09/932,505, filed on Aug. 17, 2001, which is a division of application No. 09/270,146, filed on Mar. 16, 1999, now abandoned.

(51) Int. Cl.[7] ............................ G02F 1/13; G02F 1/136; H01L 21/44
(52) U.S. Cl. ........................ 349/187; 349/45; 438/107
(58) Field of Search ................... 349/42, 45, 187; 428/209, 210; 438/106, 107, 28; 257/13, 688, 690, 723

(56) References Cited

U.S. PATENT DOCUMENTS

| | | | | |
|---|---|---|---|---|
| 3,439,416 A | * | 4/1969 | Yando ........................... | 29/625 |
| 4,191,800 A | * | 3/1980 | Holtzman ...................... | 442/233 |
| 4,514,583 A | * | 4/1985 | Izu et al. ....................... | 136/259 |
| 4,966,442 A | * | 10/1990 | Ono et al. ..................... | 349/122 |
| 5,034,802 A | | 7/1991 | Liebes, Jr. et al. ........... | 257/672 |
| 5,436,744 A | * | 7/1995 | Arledge et al. ............... | 349/150 |
| 5,453,864 A | * | 9/1995 | Yamada et al. ............. | 252/299.6 |
| 5,545,291 A | * | 8/1996 | Smith et al. .................. | 438/107 |
| 5,904,545 A | | 5/1999 | Smith et al. .................. | 438/455 |
| 6,274,508 B1 | * | 8/2001 | Jacobsen et al. ............ | 438/758 |
| 6,281,038 B1 | * | 8/2001 | Jacobsen et al. ............ | 438/106 |
| 6,316,278 B1 | * | 11/2001 | Jacobsen et al. ............. | 438/22 |
| 6,468,638 B2 | * | 10/2002 | Jacobsen et al. ............ | 428/209 |
| 2001/0031514 A1 | * | 10/2001 | Smith ........................... | 438/107 |

FOREIGN PATENT DOCUMENTS

| | | | |
|---|---|---|---|
| EP | 0 747 948 | 12/1996 | ........... H01L/21/98 |
| WO | WO 99/67678 | 12/1999 | ............ G02F/1/00 |

OTHER PUBLICATIONS

Nakamura, Eiji, et al.; 37.3: Development Of Electrophoretic Display Using Microcapsulated Suspension; SID International Symposium Digest Of Technical Papers, US, Santa Ana, CA.; SID vol. 29, 1998; pp. 1014–1017.

Wu, C.C.; Integration of Organic LED's and Amorphous Si TFT's onto Flexible and Lightweight Metal Foil Substrates; IEEE Electron Device Letters, US, IEEE Inc., New York; vol. 18, No. 12, Dec. 1, 1997; pp. 609–612.

Search Report for PCT/US 99/30391 mailed May 23, 2000; 5 pages.

* cited by examiner

Primary Examiner—Tarifur R. Chowdhury
(74) Attorney, Agent, or Firm—Blakely, Sokoloff, Taylor & Zafman LLP

(57) ABSTRACT

Apparatuses and methods for forming displays are claimed. One embodiment of the invention relates to forming a flexible active matrix display along a length of flexible substrate. Another embodiment of the invention relates to forming multiple flexible displays along a continuous flexible substrate. Another embodiment of the invention relates to forming a flexible display along a flexible reflective substrate. Another embodiment of the invention relates to using FSA generally with a flexible web process material. Another embodiment of the invention relates to using FSA and a deterministic method such as "pick and place" to place objects onto a rigid substrate or onto a web process material. Another embodiment of the invention relates to using web processing to deposit and/or pattern display material through an in-line process.

8 Claims, 19 Drawing Sheets

APPARATUSES AND METHODS FOR FLEXIBLE DISPLAYS

RELATED APPLICATIONS

This is a continuation of application Ser. No. 09/932,505, now U.S. Pat. No. 2002/001046, filed on Aug. 17, 2001, which is a divisional of application Ser. No. 09/270,146, filed on Mar. 16, 1999, now abandoned.

BACKGROUND INFORMATION

This application claims the benefit of the earlier filing date of co-pending provisional application of Jeffrey Jay Jacobsen entitled. "Apparatuses and Methods for Forming Assemblies." Ser. No. 60/118,887, filed Feb. 5, 1999 and incorporated herein by reference.

1. Field of the Invention

The present invention relates generally to the field of fabricating assemblies such as display panels More particularly, the present invention relates to apparatuses and methods for (1) forming a flexible active matrix display along a length of a flexible substrate; (2) forming multiple displays along a continuous flexible substrate; (3) forming a flexible display along a flexible reflective substrate; (4) using fluidic self-assembly (FSA) generally with a flexible web process material; (5) using FSA and a deterministic method, such as "pick and place," to place objects onto a rigid substrate or onto a web process material; and, (6) using web processing to deposit and/or pattern display material through an in-line process.

2. Description of Related Art

Fabrication of display panels is well known in the art. Display panels may be comprised of active matrix or passive matrix panels. Active matrix panels and passive matrix panels may be either transmissive or reflective. Transmissive displays include polysilicon thin-film transistor (TFT) displays, and high-resolution polysilicon displays. Reflective displays typically comprise single crystal silicon integrated circuit substrates that have reflective pixels.

Liquid crystals, electroluminescent (EL) materials, organic light emitting diodes (OLEDs), up and downconverting phosphor (U/DCP), electrophoretic (EP) materials, or light emitting diodes (LEDs) may be used in fabricating flat-panel display panels. Each of these is known in the art and is discussed briefly below.

Liquid crystal displays (LCDs) can have an active-matrix backplane in which thin-film transistors are co-located with LCD pixels. Flat-panel displays employing LCDs generally include five different components or layers: a White or sequential Red, Green, Blue light source, a first polarizing filter that is mounted on one side of a circuit panel on which the TFTs are arrayed to form pixels, a filter plate containing at least three primary colors arranged into pixels, and a second polarizing filter. A volume between the circuit panel and the filter plate is filled with a liquid crystal material. This material will rotate the polarized light when an electric field is applied between the circuit panel and a transparent ground electrode affixed to the filter plate or a cover glass. Thus, when a particular pixel of the display is turned on, the liquid crystal material rotates polarized light being transmitted through the material so that it will pass through the second polarizing filter. Some liquid crystal materials, however, require no polarizers. Polarizers are made by a company known as SRI. LCDs may also have a passive matrix backplane which is usually two planes of strip electrodes which sandwich the liquid crystal material. However, passive matrices generally provide a lower quality display compared to active matrices. Liquid crystal material includes, but is not limited to, twisted nematic (TN), Super TN, double STN, and ferroelectric. U/DCP and EP displays are formed in a similar fashion except the active medium is different (e.g., upconverting gas. downconverting gas, electrophoretic materials).

EL displays have one or more pixels that are energized by an alternating current (AC) that must be provided to each pixel by row and column interconnects. EL displays generally provide a low brightness output because passive circuitry for exciting pixel phosphors typically operates at a pixel excitation frequency that is low relative to the luminance decay time of the phosphor material. However, an active matrix reduces the interconnect capacitance allowing the use of high frequency AC in order to obtain more efficient electroluminescence in the pixel phosphor. This results in increased brightness in the display.

LED displays are also used in flat-panel displays. LEDs emit light when energized. OLEDs operate like the LEDs except OLEDs use organic material in the formation of the diode.

Regardless of the type of active medium used, displays are generally comprised of at least a substrate and a backplane. The backplane forms the electrical interconnection of the display and comprises electrodes, capacitors, and transistors in at least some embodiments of a backplane.

FIG. 1A illustrates a rigid display device wherein the active matrix display backplane 10 is coupled to a rigid substrate 12. Typically, the active matrix display backplane is also rigid. FIG. 1B shows another rigid display. There, the active matrix display backplane 10 is coupled to a rigid substrate 12 (e.g., glass). Also shown is a plurality of blocks 14. These blocks may be fabricated separately and then deposited into holes on substrate 12 by a process known as fluidic self assembly; an example of this process is described in U.S. Pat. No. 5,545,291. These blocks may each contain driver circuitry (e.g., MOSFET and capacitor) for driving a pixel electrode. The active matrix backplane includes transparent pixel electrodes and row/column interconnects (not shown) to electrically interconnect the blocks 14. The plurality of blocks 14 is coupled to the active matrix display backplane 10 and the rigid substrate 12. FIG. 1C shows a reflective display 16 coupled to a rigid substrate 12. FIG. 1D shows a reflective display 16 coupled to a rigid substrate 12. A plurality of blocks 14 is coupled to the reflective display 16 and to the rigid substrate 12.

Placing elements, such as pixel drivers, on a rigid substrate is well known. Prior techniques can be generally divided into two types: deterministic methods or random methods. Deterministic methods, such as pick and place, use a human or robot arm to pick each element and place it into its corresponding location in a different substrate. Pick and place methods generally place devices one at a time and are generally not applicable to very small or numerous elements such as those needed for large arrays, such as an active matrix liquid crystal display.

Random placement techniques are more effective and result in high yields if the elements to be placed have the right shape. U.S. Pat. No. 5,545,291 describes a method that uses random placement. In this method, microstructures are assembled onto a different substrate through fluid transport. This is sometimes referred to as fluidic self-assembly. Using this technique, various blocks, each containing a functional component, may be fabricated on one substrate and then separated from that substrate and assembled onto a separate rigid substrate through the fluidic self assembly (FSA) process. The blocks which are deposited onto receptor regions of a substrate may include any of a number of different functional components, such as LEDs, pixel drivers, sensors, etc. An example of a particular type of block and its functional component is described in copending U.S. patent application Ser. No. 09/251,220 which was filed Feb. 16, 1999 by the inventor John Stephen Smith and which is entitled "Functionally Symmetric Integrated Circuit Die". This application is hereby incorporated herein by reference.

As noted above. FIGS. 1B and 1D illustrate a display substrate 12 with blocks 14 formed in the rigid substrate 12. These blocks 14 may be deposited through an FSA process. In the FSA process, a slurry containing the blocks 14 is deposited over the rigid substrate 12 and the blocks 14 rest in corresponding openings in the substrate 12.

FIG. 2 shows a block 14 and a circuit element 18 on the top surface of block 14. Generally, blocks have a trapezoidal cross-section where the top of the block is wider than the bottom of the block.

FIG. 3 shows block 14 in a recessed region of the rigid substrate 12. Between the block and the rigid substrate is an eutetic layer 13. The block has a top surface 18.

FIG. 4 shows a planar side view of a rigid substrate coupled to a rigid display backplane with a plurality of blocks between the display backplane 30 and substrate 12. The plurality of blocks are functionally part of the display backplane 30 and are deposited onto receptor regions of the substrate 12. Each block drives at least one transparent pixel electrode. The electrode pixel is fabricated over a transistor which is fabricated in the block.

FIG. 5 shows a portion of an array in an active matrix display backplane. The control line rows 31 and 32 in this device are coupled to gate electrodes along a row and the control line columns 34 and 35 are coupled to data drivers which supply pixel voltages which are applied to the pixel electrodes. A column line 34 is connected to a source electrode of field effect transistor (FET) 36. Another column line 35 is coupled to a source electrode of FET 37. A row line 32 is coupled to the gates of both FETs 36 and 37. The drain of FET 36 is coupled through capacitor 38 to a transparent pixel electrode along the row 32 formed by FETs 36 and 37, and the drain of FET 37 is coupled through a capacitor to another pixel electrode along the row. In one typical example, the backplane may be formed by depositing blocks using an FSA technique, into a rigid substrate (e.g., glass); each block contains a FET and a capacitor and is interconnected to other blocks by column and row conductors that are deposited onto the rigid substrate; and, the capacitor is coupled to a pixel electrode by another conductor that is deposited onto the rigid substrate. The active medium (e.g., a liquid crystal) is deposited at least on the pixel electrodes which will optically change the active medium's properties in response to the combined voltages or currents produced by the pixel electrodes. The active medium at a given pixel electrode 42 will appear as a square or dot in the overall checkerboard type matrix of the display. The actual size of the FETs and the pixel electrodes 42 are not now drawn to scale, but are shown schematically for the purposes of illustration. FIG. 6 shows pixel electrodes 46 on top of a substrate 48.

There are several disadvantages inherent to the related art. Rigid flat-panel displays are limited in that they are generally coupled to rigid objects. Flexible objects may cause too much stress on rigid flat-panel displays that could affect the electrical interconnections in rigid flat-panel displays.

Another disadvantage to these flat-panel displays is that they are manufactured in a batch operation. Batch operations inherently involve a certain amount of down time in production. This increases production time to fabricate display panels. Additionally, flat-panel displays are generally fabricated on rigid substrates that are not continuous in length. This also decreases productivity since the assembly of the flat-panel displays is interrupted until another substrate panel is available to assemble the flat-panel display.

SUMMARY

The present invention provides various apparatuses and methods for creating a display. One aspect of the invention involves creating a flexible active matrix display. Here, a flexible active matrix display is created by coupling an active matrix display backplane to a substrate.

Another aspect of the invention involves a flexible continuous substrate upon which multiple flexible displays are fabricated. Here, a flexible substrate is produced that has a pre-determined thickness and width, but the length of the flexible substrate is continuous (or, at least, continuous relative to a single display). The flexible continuous substrate, along with the display device components, are advanced through a web processing apparatus and separated into individual displays after fabrication. The separated components may be coupled to a mating display component. For example, a separated display component may be coupled to a television or a computer.

Another aspect of the invention relates to a flexible substrate with a reflective display backplane.

Another aspect of the invention relates to moving a flexible substrate through a web process apparatus. A web process apparatus has a plurality of support members that advance the flexible substrate through an in-line process. While the flexible substrate is moving (or while it is temporarily stopped), a slurry that contains a plurality of objects is deposited onto the flexible substrate in a manner similar to an FSA process. These objects slide into receptor regions in the flexible substrate. In one embodiment, the flexible substrate is coupled to a display tape that includes a display mechanism. The display tape is a flexible material such as polyether sulfone (PES), polyester terephihalate, polycarbonate, polybutylene terephthalate, polyphenylene sulfide (PPS), polypropylene, polyester, aramid, polyamide-imide (PAI), polyimide, aromatic polyimides, polyetherimide, metallic materials, acrylonitrile butadiene styrene. and polyvinyl chloride. The substrate, such as plastic, advances through the web process apparatus. In one embodiment, as the substrate advances through the web process apparatus, apertures are made into the substrate. Apertures are also made in the display tape as it advances through the web process apparatus. The apertures serve, in one sense, to align the substrate and the display tape. Apertures can also be made in the display tape to allow blocks to couple with the display tape. The final display that is produced from this operation of combining the substrate and the display tape may be organic light-emitting diode, upconverting phosphorus, downconverting phosphorus, electrophoretic liquid crystal, polymer-dispersed liquid crystal, or cholesteric liquid crystal.

Another aspect of the invention relates to an operation that occurs after the FSA has been performed. In order to verify that the FSA process results in complete circuit element block placements, a "pick and place" process is utilized. This allows the blocks to be placed into an empty recessed region onto the substrate that was missed during FSA process. "pick and place" may occur on a rigid substrate or on a web process material. The substrate is first checked for empty recessed regions. This is done by using an electronic eye viewing the substrate for empty recessed regions. Once an empty recessed region is detected, a robot is used to "pick and place" an object into an empty recessed region of the substrate.

Another aspect of the invention relates to web processing wherein display material (e.g., display material that provides a display mechanism such as an upconverting phosphorus) is deposited or patterned through an in-line process during the fabrication of displays. This method involves a flexible substrate wherein display material is placed onto the flexible substrate. This process is repeated for each display that is manufactured. The flexible substrate, which may be considered a display tape, is then coupled to a backplane that is on a separate substrate.

In one embodiment, the substrate has apertures that are added through a laser, punch press, template, or other operation. While the substrate is advanced through the in-line process, the FSA process is applied to the substrate. This allows the blocks to drop into the plurality of recessed regions in the substrate. The substrate is then advanced to the next operation wherein an interconnect is deposited. The substrate is then coupled to the display tape (either separating the sections of displays or before separating the displays from the tape).

While an array of components (e.g., display components) for an assembly have been described as examples of the invention, an array of other assemblies such as x-ray detectors, radar detectors, micro-electro-mechanical structural elements (MEMS) or, generally, an assembly of sensors or actuators or an assembly of circuit elements also may be produced using the claimed invention. Thus, for example, flexible antennas, other sensors. detectors, or an array of circuit elements may be fabricated using one of the embodiments of the inventions. Other aspects and methods of the present invention as well as apparatuses formed using these methods are described further below in conjunction with the following figures.

BRIEF DESCRIPTION OF THE DRAWINGS

The present invention is illustrated by way of example. The invention is not limited to the figures of the accompanying drawings in which like references indicate similar elements.

DETAILED DESCRIPTION

Figure 1A:
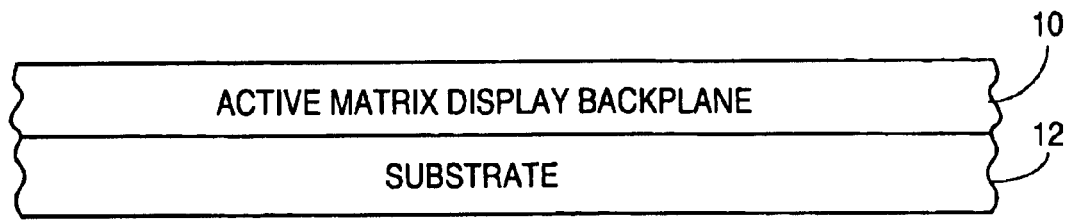
FIG. 1A shows a planar side view of an active matrix display backplane coupled to a rigid substrate.
Figure 1B:
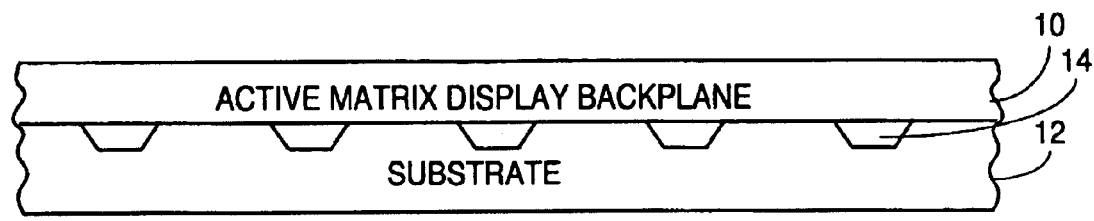
FIG. 1B shows a planar side view of an active matrix display backplane coupled to a rigid substrate wherein a plurality of blocks are part of the active matrix display.
Figure 1C:
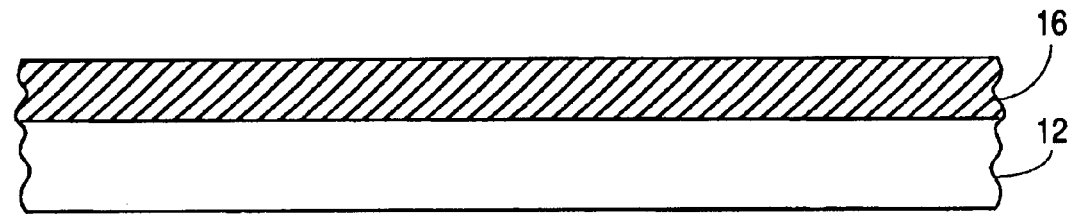
FIG. 1C shows a planar side view of a reflective display backplane coupled to a rigid substrate.
Figure 1D:
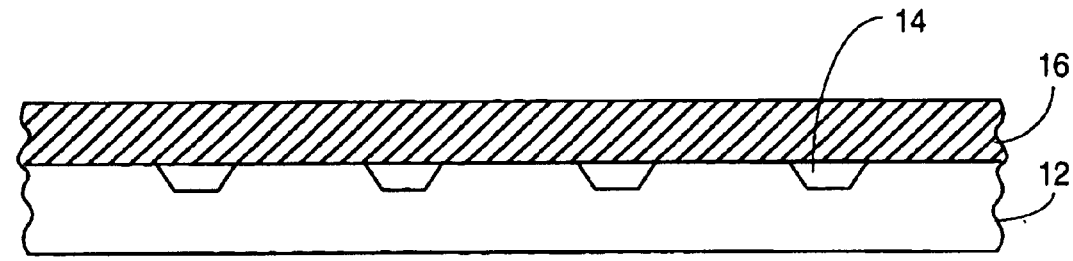
FIG. 1D shows a planar side view of a reflective display backplane coupled to a rigid substrate wherein a plurality of blocks are coupled to the reflective display and to the rigid substrate.
Figure 2:
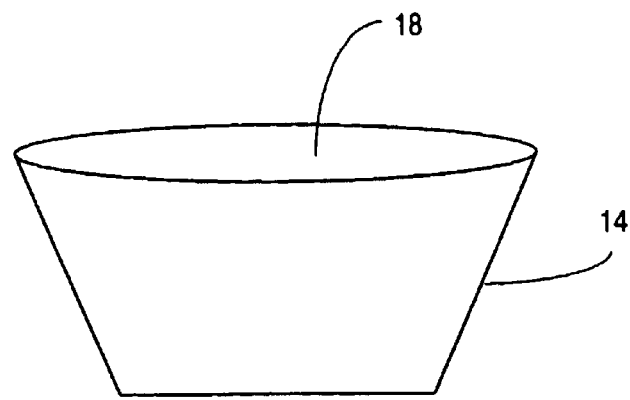
FIG. 2 shows a lop perspective view of a circuit element block.
Figure 3:
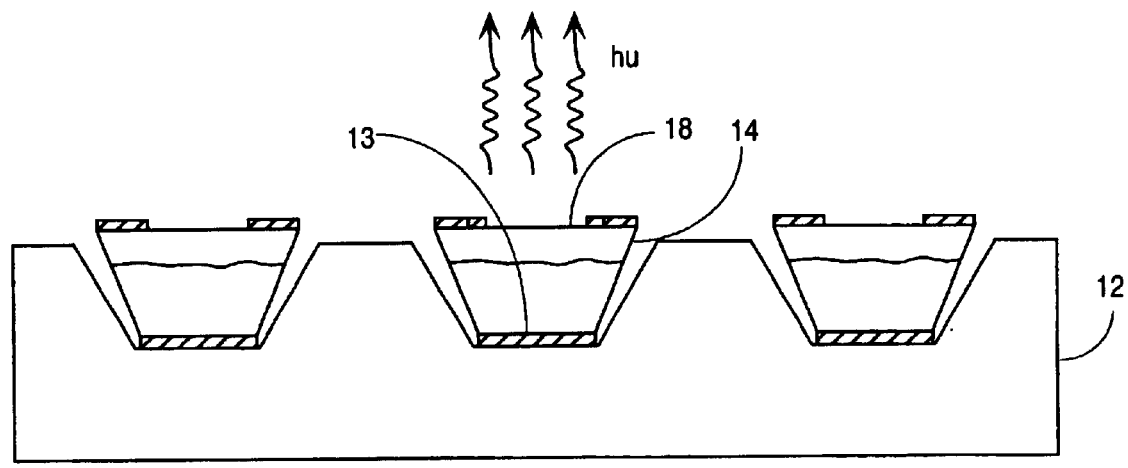
FIG. 3 shows a planar side view of blocks in recessed regions of the rigid substrate and a metalization surface on the blocks.
Figure 4:
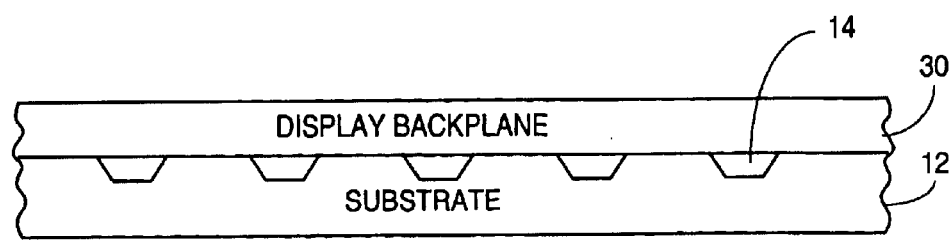
FIG. 4 shows a planar side view of a rigid substrate coupled to a rigid display backplane with a plurality of blocks between the display backplane and substrate.
Figure 5:
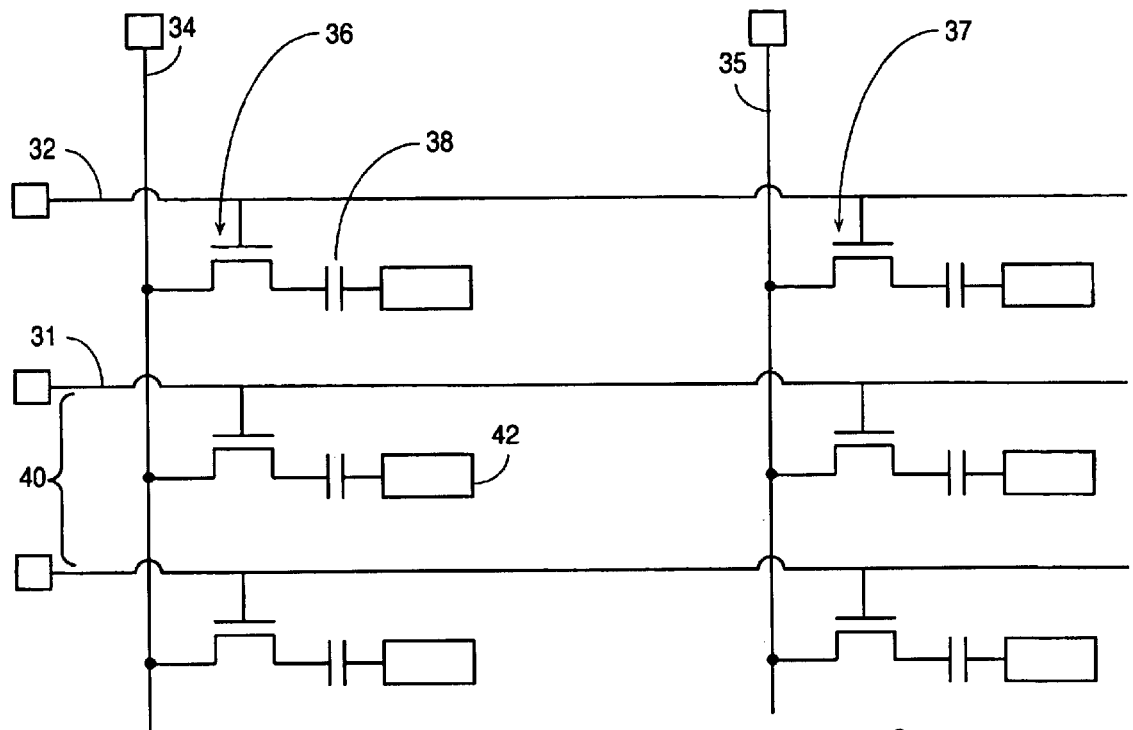
FIG. 5 schematically represents a portion of an array of an active matrix backplane.

The present invention relates to apparatuses and methods for forming displays. The following description and drawings are illustrative of the invention and are not to be construed as limiting the invention.

One embodiment in accordance with the invention includes a flexible active matrix display panel coupled to a substrate. By fabricating an active matrix display device that is flexible, the active matrix display panel can be fitted to an object that is either rigid or flexible and that has a non-planar surface. Other embodiments of the invention include a method of making a flexible continuous substrate upon which multiple flexible displays are fabricated. The multiple flexible displays may be of similar or different sizes. These displays are separated from one another as the substrate is advanced through the web processing apparatus. The backplane of the display may be comprised of a plurality of blocks wherein each block has a circuit element thereon. The blocks are contained in a slurry that is deposited onto the flexible substrate. Although blocks may be comprised of single crystal silicon or other like material which makes the block rigid, the substrate may still be flexible because the size of these blocks (50×100 microns or 100×100 microns) is small in comparison to the flexible substrate. The size of these blocks is in the micron orders where as the size of the substrate is much larger for example, like that of an active matrix display backplane or as large as a credit card. Comparing the blocks' size to the flexible substrate's size, the blocks are substantially smaller than the flexible substrate (e.g. blocks of micron size comparing to flexible substrates having sizes in the order of centimeter or inches). These blocks may also have recessed regions wherein another micro-electro-mechanical structural element may be deposited thereon. The flexible substrate forms part of a display backplane. The flexible displays may be either an active matrix or a passive matrix displays.

Another embodiment of the invention relates to a flexible substrate with a reflective display backplane.

Another embodiment of the invention involves using FSA generally with a flexible web processed material. Incorporated by reference is U.S. Pat. No. 5,545,291 explaining how to assemble microstructures onto a substrate. With embodiments of the invention, a flexible substrate is advanced through a web process apparatus. The FSA with a plurality of blocks (or other functional elements) is deposited onto the flexible substrate wherein the blocks fall into recessed regions found in the flexible substrate. The substrate is then advanced to a further point in the process wherein an interconnect layer is deposited onto the substrate. While the substrate is advanced, a display tape is advanced to a point wherein the flexible substrate becomes coupled to the display tape.

Before the coupling takes place, a metal interconnect is placed onto the backplane. A display material is then deposited onto the display tape. The display material may be cholesteric liquid crystal, polymer-dispersed liquid crystal or other type of material. The display material is layered or patterned on the display tape. The displays tape is then advanced to a point wherein the metal interconnect is deposited or etched on the display material. This is done by using laser etch, ink jet, screen print, deposit, or lithography and etch. After this point, the display tape may be laser cut, punched, sealed, or trimmed. Coupling takes place at a point further along in the process.

Another embodiment of the invention relates to the FSA process wherein, after the blocks are deposited on the substrate, they fall into recessed regions found in the substrate. After a certain time period, the substrate is checked for any existing empty recessed regions. Finding empty recessed regions is accomplished by using an electronic eye attached to a machine that is able to view the surface of the substrate. A robot or a person is used to place an object on an empty recessed region.

Another embodiment of the invention relates to FSA being applied to a substrate that has a first receptor region and a second receptor region. These regions may be of similar or different sizes. The objects that are contained in the slurry drop into the respective receptor regions that most closely match the size of the object.

A continuous process as in the invention offers the advantage of increasing the number of flat-panel displays produced, thereby reducing the cost of manufacturing the displays. FSA in conjunction with a deterministic method of placing blocks (e.g., "pick and place") with circuit elements of objects onto a rigid substrate or a web process material is disclosed. In this aspect of the invention, the recessed regions of the substrate are checked for empty regions. If there is an empty recessed region in the substrate, an object is robotically placed into the empty recessed region. The advantage offered by robotically placing an object into an empty recessed region of a substrate is that it increases the overall effectiveness and the quality of the displays.

In the following description, numerous specific details such as specific materials, processing parameters, processing steps, etc., are set forth in order to provide a thorough understanding of the invention. One skilled in the art will recognize that these details need not be specifically adhered to in order to practice the claimed invention. In other instances, well known processing steps, materials, etc. are not set forth in order not to obscure the invention.

Figure 6:
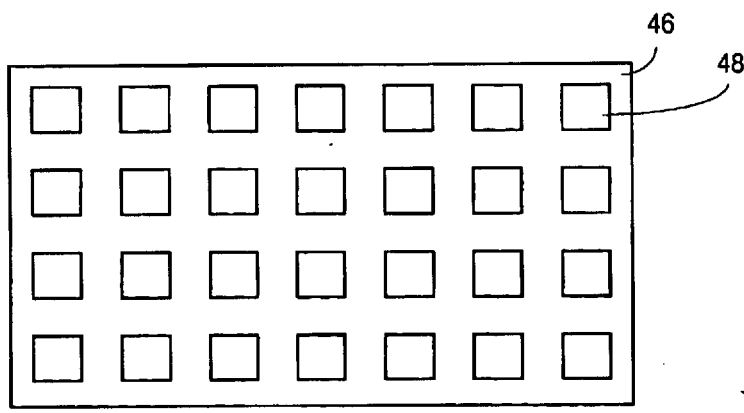
FIG. 6 shows a top view of a plurality of pixel electrodes in a backplane.

FIG. 6 shows pixel electrodes 46 on top of a substrate 48.

Figure 7A:
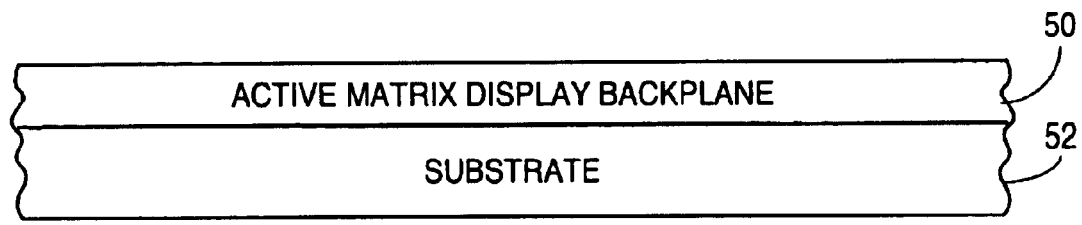
FIG. 7A shows a planar side view of a flexible display device wherein an active matrix display backplane is coupled to a flexible substrate.
Figure 7B:
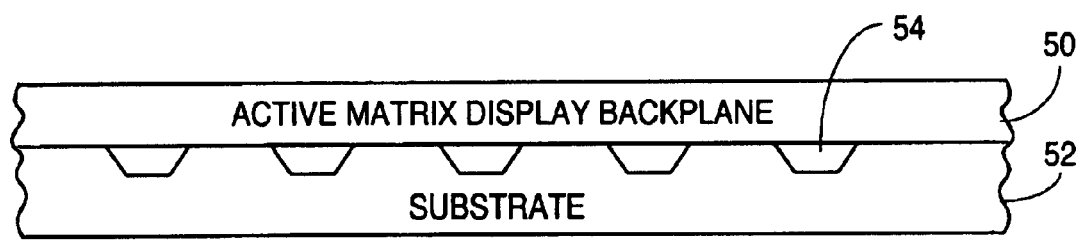
FIG. 7B shows a planar side view of a flexible display device wherein an active matrix display backplane is formed on a flexible substrate wherein a plurality of blocks are formed on the flexible substrate and flexible interconnect layers and pixel electrodes are deposited onto the flexible substrate.
Figure 7C:
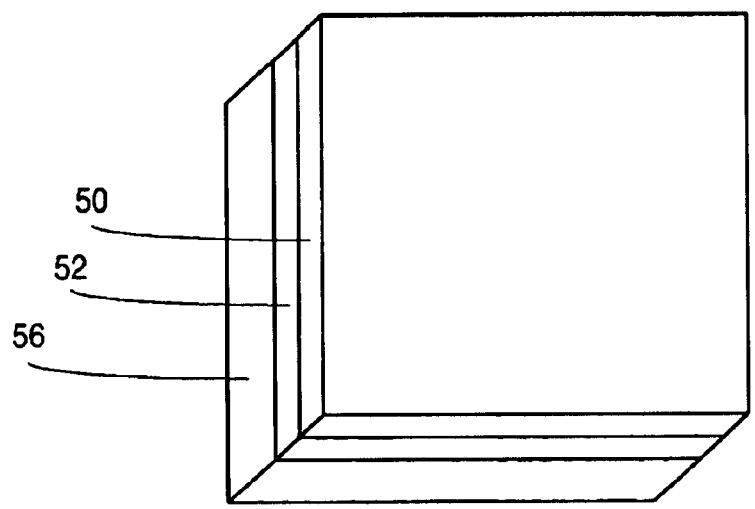
FIG. 7C shows a top view of a flexible display device comprising an active matrix display backplane coupled to a flexible substrate wherein the flexible display device is coupled to an object.

FIG. 7A shows a flexible display device, one embodiment of the invention. Here, an active matrix display backplane is coupled to a flexible substrate 52. The active matrix may include pixel electrodes and spatial light modulars. FIG. 7B shows a flexible display device wherein the active matrix display backplane 50 is coupled to a flexible substrate 52. Bistable crystal may be used in conjunction with the flexible substrate 52. A display of this type may be used in credit cards or some other type of card that has flexibility. Blocks 54 are deposited onto the flexible substrate and are part of the active matrix display backplane. The block 54 comprises an active circuit element (not shown) that drives a picture element (not shown). FIG. 7C shows the top view of a flexible display device wherein an active matrix display backplane 50 is coupled to a flexible substrate 52. The flexible display device is coupled to an object 56. The flexible display device conforms to the shape of the object 56.

Figure 8A:
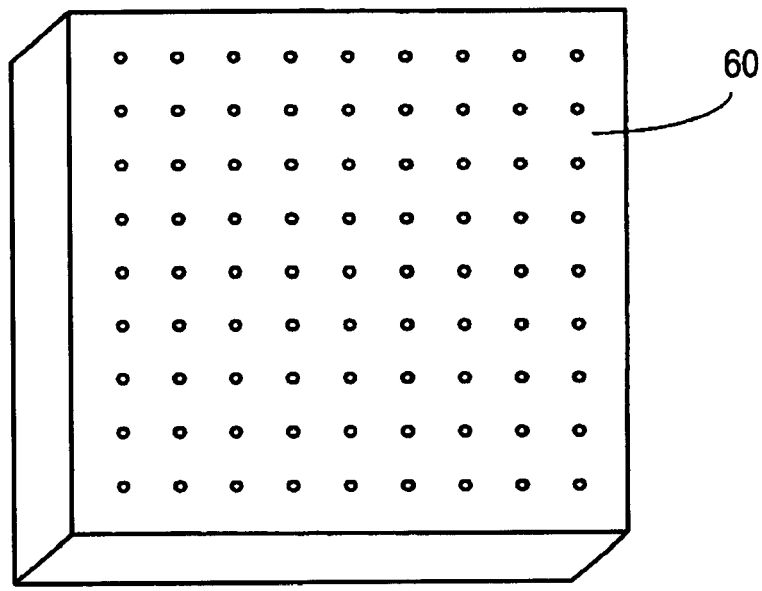
FIG. 8A shows a top view of an active matrix display backplane.
Figure 8B:
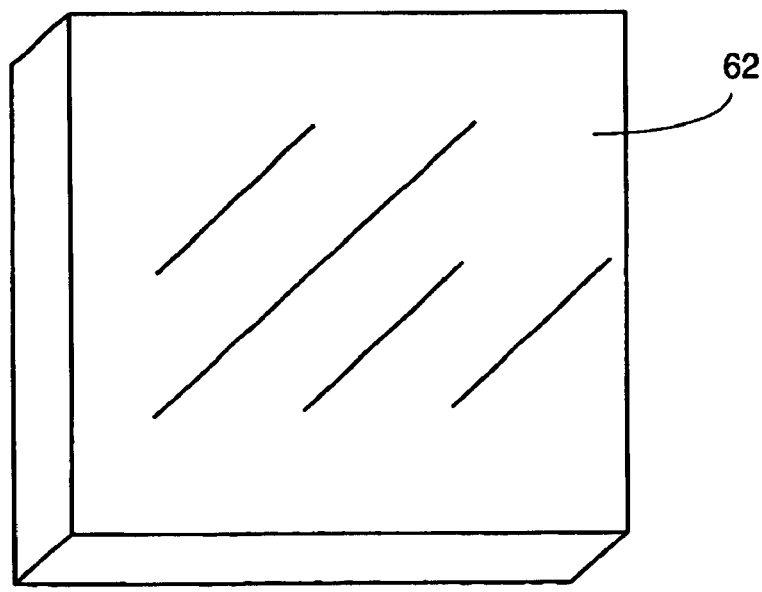
FIG. 8B shows the top view of a passive matrix display backplane
Figure 8C:
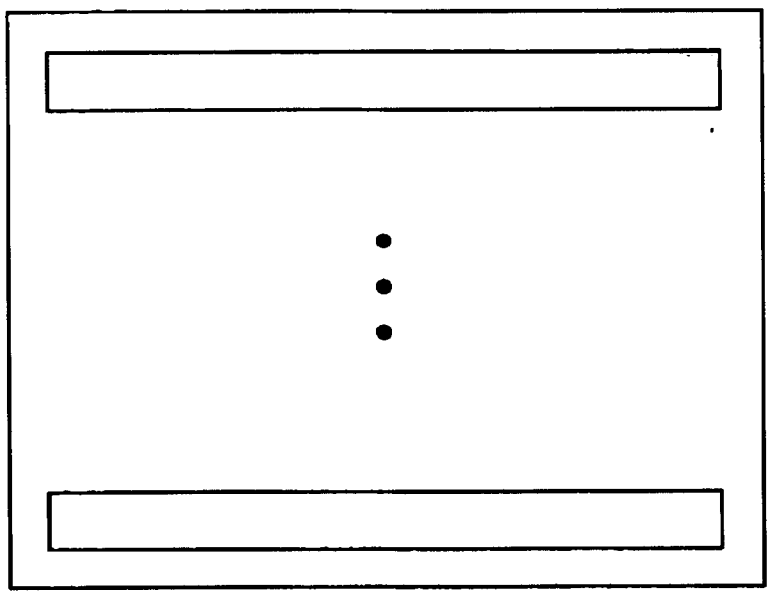
FIG. 8C shows the top layer of a passive matrix display backplane.
Figure 8D:
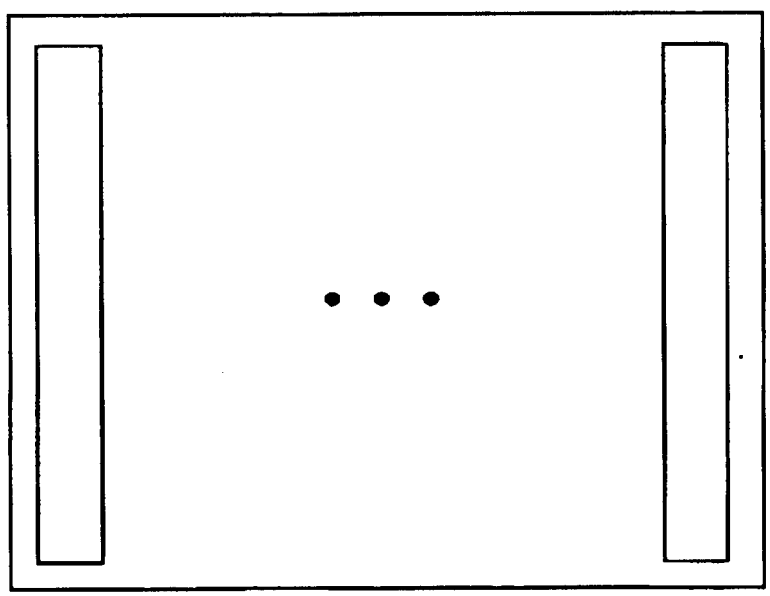
FIG. 8D shows a bottom layer of a passive matrix display backplane.

FIG. 8A shows an active matrix display backplane 60. The plurality of blocks in the active matrix display backplane contain the active circuit element. This display backplane is flexible. FIG. 8B shows a passive matrix display backplane 62. This display backplane is flexible. FIG. 8C shows the top layer of a passive matrix backplane. FIG. 8D shows the bottom layer of a passive matrix backplane.

Figure 9:
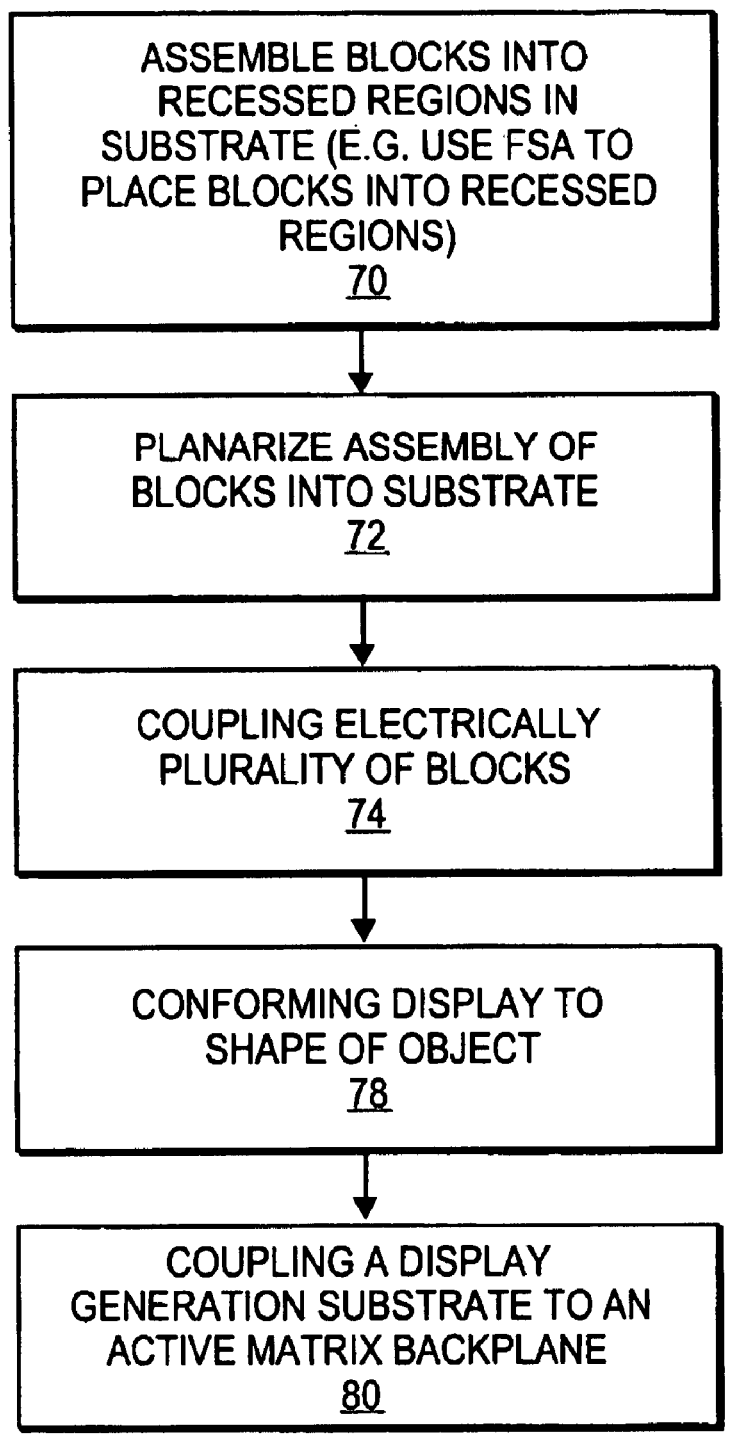
FIG. 9 shows a flow chart of the method of assembling a flexible display along the length of a flexible substrate.

FIG. 9 shows one method of assembling a flexible display along the length of a flexible substrate 70 in accordance with an embodiment of the invention. First, blocks are assembled into the openings of the flexible substrate. Utilizing an FSA process, a plurality of blocks are deposited in a slurry that go into the recessed regions of the flexible substrate. Planarization of the assembly of blocks into substrate 72 is the next step. Planarization takes place by depositing a material that may be spun to flatten or may be subjected to conventional chemical-mechanical polishing. Then, the electrical coupling of the plurality of blocks takes place at step 74 by opening holes in the planarization layer and depositing metalization material or other conductive materials into the holes and beyond the holes to form an interconnect (e.g., a row or column interconnect). The interconnect between the rows and columns is comprised of flexible and conductive material. For example, the interconnect could be made of conductive polymers, metals (e.g., aluminum, copper, silver, gold, etc.), metal particles, conductive organic compounds, or conductive oxides. The display is made to conform the object's shape 78. It should be noted that the operations for forming the display may be done in a different order than that found in FIG. 9 and thus the operation 78 may be performed after operation 80. A display generation substrate (e.g., a PDLC layer) is coupled to the active matrix backplane 80.

Figure 10:
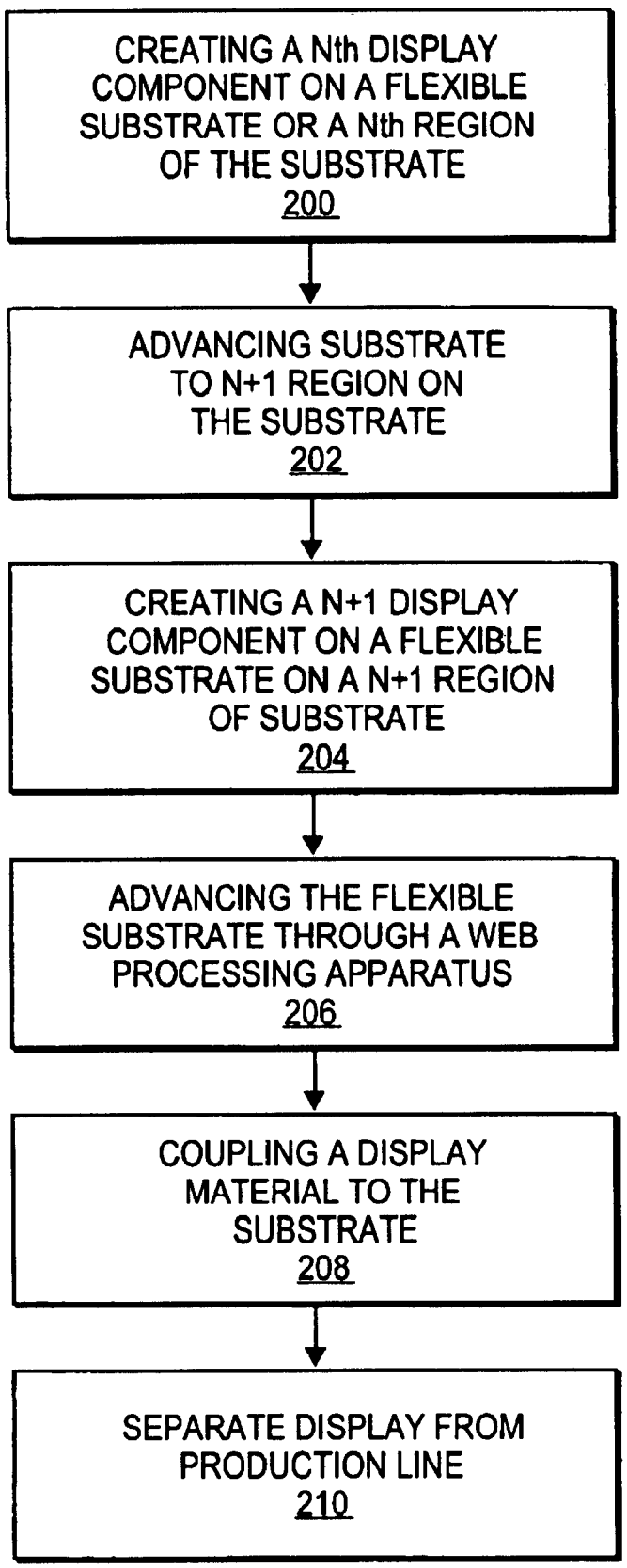
FIG. 10 shows a flow chart of the method of manufacturing multiple flexible displays along a flexible substrate.

FIG. 10 shows a method of manufacturing multiple displays along a flexible substrate. Multiple display components are created on a flexible substrate 200. The flexible substrate is advanced to a second region on the substrate 202. A new display component is created on the flexible substrate in a different region of the substrate 204 by advancing the flexible substrate through a web processing of apparatus 206 and coupling a display material to the substrate 208. Separation of the display panel occurs at the end of the process 210.

Figure 11:
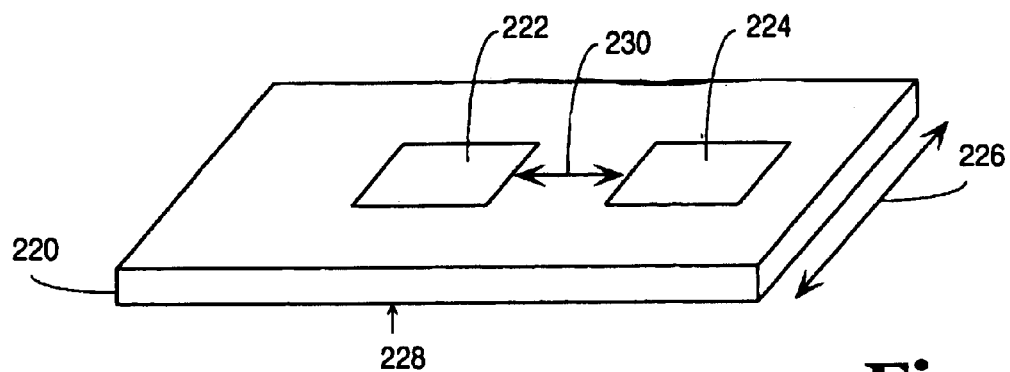
FIG. 11 shows a top view of a flexible substrate with multiple display components fabricated thereon.

FIG. 11 shows a flexible substrate with multiple display components. The flexible substrate 220 has display component 222 and display component 224 attached thereto. The substrate has three lengths: a first length 226, a second length 228, and a third length 230. Display components 222 and 224 are active matrix display devices.

Figure 12A:
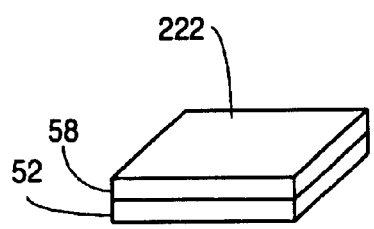
FIG. 12A shows a top view of a display component that has a passive matrix display backplane attached thereto.
Figure 12B:
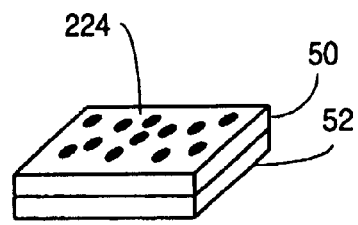
FIG. 12B shows a top view of a display component that has an active matrix display backplane attached thereto.

FIG. 12A shows display component 222 that has a passive matrix display backplane attached thereto. FIG. 12B shows a display component 224 that has an active matrix display backplane attached thereto.

Figure 13:
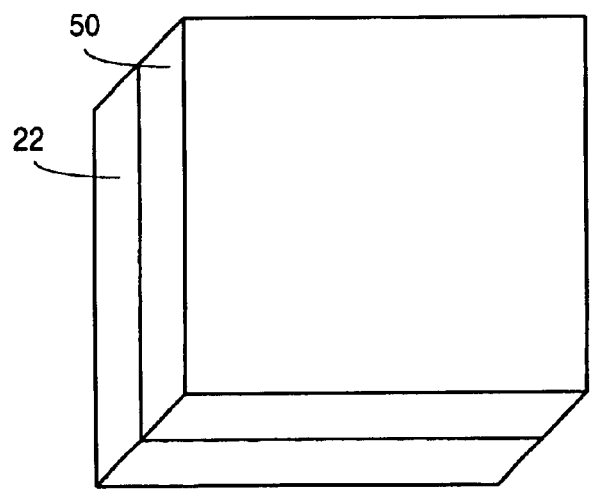
FIG. 13 shows a top view of flexible substrate attached to a display backplane.

FIG. 13 shows a flexible substrate 50 attached to a display backplane.

Figure 14A:
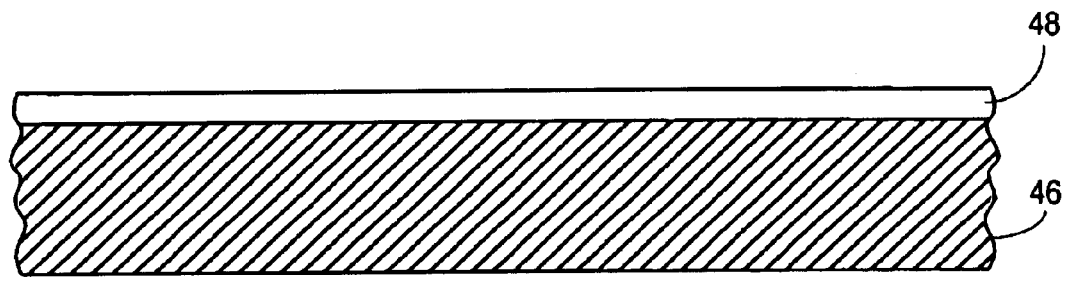
FIG. 14A shows a planar side view of a backplane interconnect layer coupled to a flexible substrate.
Figure 14B:
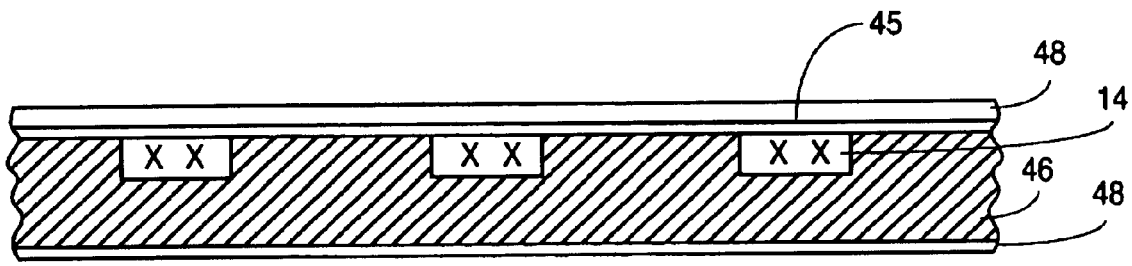
FIG. 14B shows a planar side view of a backplane interconnect layer coupled to a flexible substrate wherein blocks are coupled to the backplane interconnect layer and to the flexible substrate.
Figure 14C:
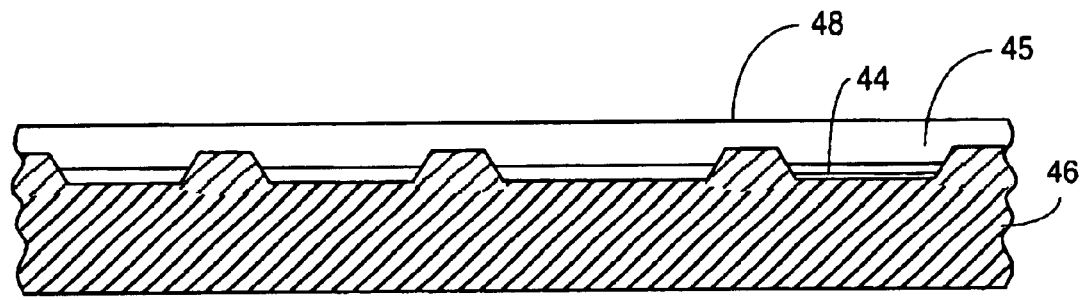
FIG. 14C shows a planar side view of a flexible reflective display coupled to a flexible substrate that has holes or recesses to accept blocks.

FIG. 14A shows a reflective display backplane 48 coupled to a flexible substrate 46. FIG. 14B shows a flexible reflective display backplane 48 coupled to a substrate 46. Blocks 14 are coupled to the flexible substrate 46 and to the flexible reflective display backplane 48. The reflective display backplane includes an interconnect layer 45. This interconnect layer 45 typically is comprised of metallic material. Coupled to the flexible substrate is a flexible reflector 48. FIG. 14C shows a flexible reflective display wherein recessed region 45 contains reflective material 44. The substrate 46 is coupled to the reflective display backplane 48.

Figure 15A:
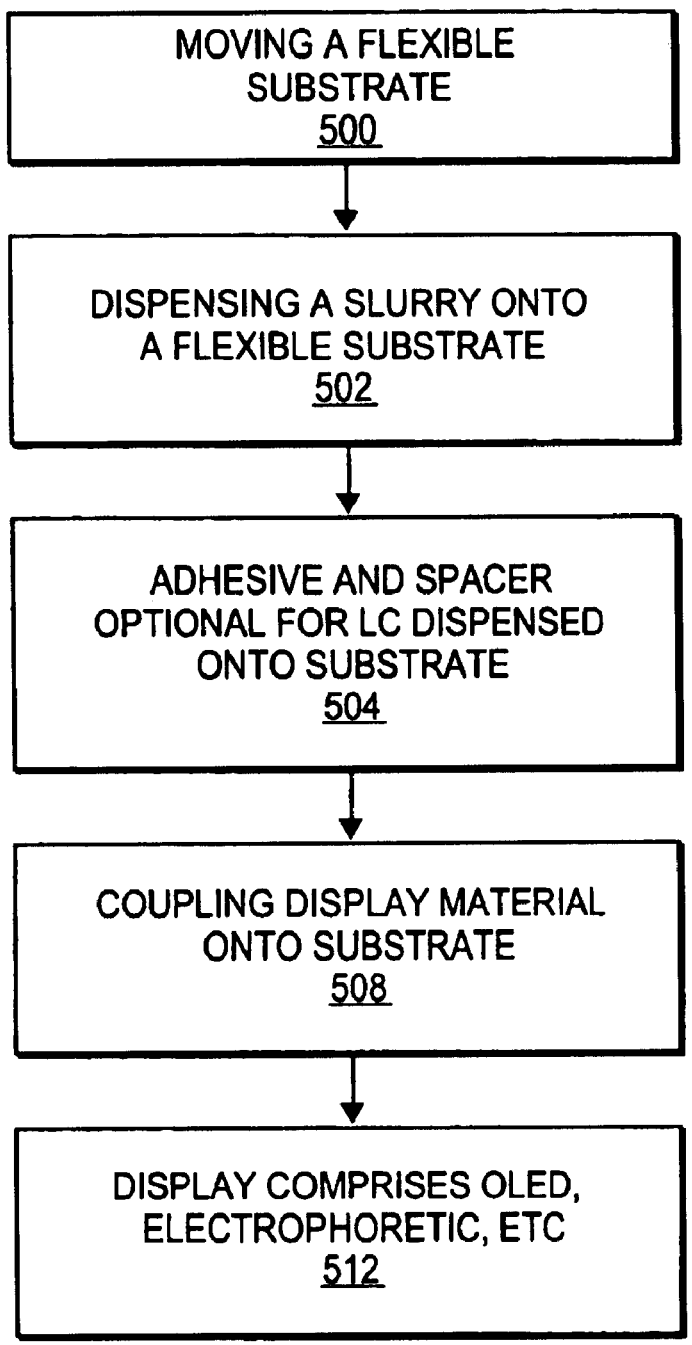
FIG. 15A shows a flow chart of a method of fabricating a display device wherein a flexible substrate and a display tape undergo processing and are subsequently coupled.

FIG. 15A shows a method of fabricating a display device wherein a flexible substrate and a display tape undergo processing and are subsequently coupled. There, the flexible substrate is advanced along a process line 500. A slurry containing a plurality of blocks is dispensed onto the flexible substrate 502. A second slurry containing a plurality of blocks is again dispensed onto the substrate. Excess slurry is collected in a container and is recycled. The blocks fall into recessed regions in the substrate. Adhesives and spacers are deposited onto the substrate 504. Display material is placed onto the substrate 508. This material may comprise polymer-dispersed liquid crystal, cholesteric liquid crystal, electrophoretic liquid crystal, upconverting phosphor, or downconverting phosphor 512.

Figure 15B:
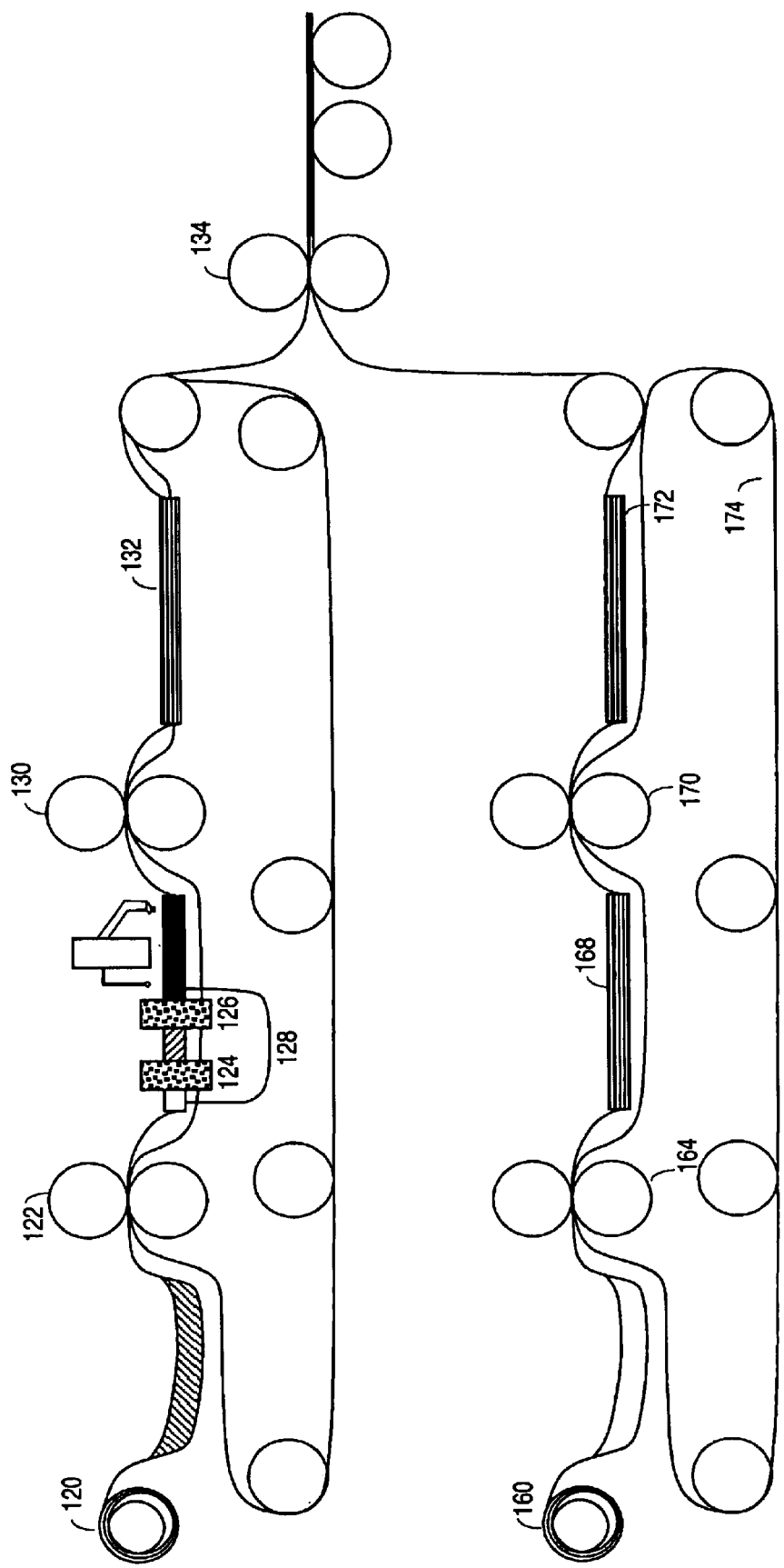
FIG. 15B shows schematically a method of fabricating a display device wherein a flexible substrate and a display tape undergo processing and are subsequently coupled.

FIG. 15B shows the overall process of fabricating a display device wherein a flexible substrate 120 and a display tape 160 undergo processing and are subsequently coupled. There, the flexible substrate is advanced along a first process line and advances through a first set of support members 122. A first slurry 124 containing a plurality of blocks is dispensed onto the flexible substrate. A second slurry 126 containing a plurality of blocks is again dispensed onto the substrate. Excess slurry is collected in a container 128 and is recycled. The blocks fall into recessed regions in the substrate. It should be noted that a polarizing or retarding film could be deposited onto the substrate before the FSA process is applied to the substrate. Flexible substrate 120 is advanced through a second set of support members 130. An interconnect 132 is then deposited onto flexible substrate 120. The flexible substrate is then advanced to point 134. In conjunction with this process, display tape 160 undergoes a separate process. Display material is placed onto at least one side of the display tape 160. Display tape 160 is advanced through a first set of support members 164. The display material is patterned or layered 168. This display material may comprise polymer-dispersed liquid crystal, cholesteric liquid crystal, electrophoretic liquid crystal, upconverting phosphor, or downconverting phosphor. Display tape 160 is advanced through a second set of support members 170. An interconnect 172 is either deposited or etched onto the display tape 160. The display tape is then advanced to point 134 where the display tape is coupled to the substrate. A conveyor belt 174 surrounds the support members.

While the process may follow these steps, it should be noted that it is also possible that one portion of the display will be singulated prior to the display tape being attached to the substrate.

Figure 16:
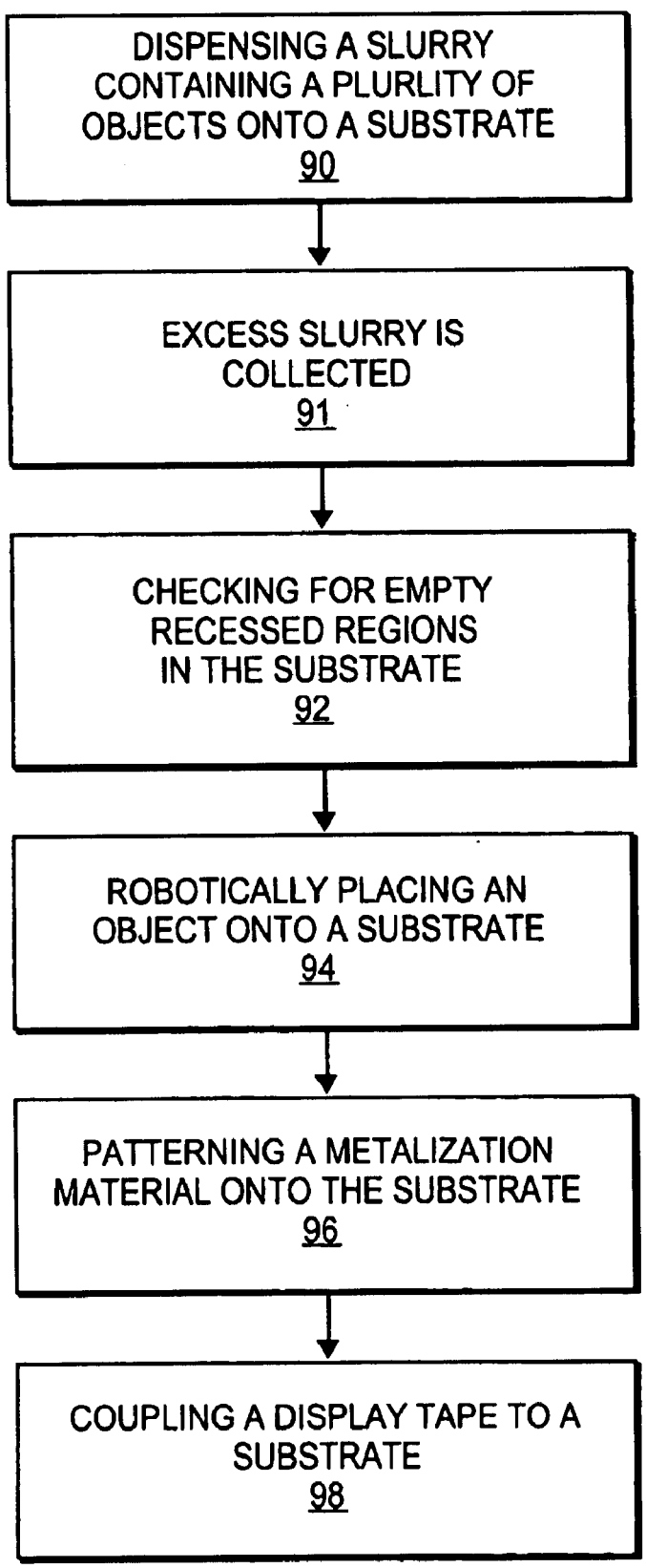
FIG. 16 shows a flow chart of a method of the picking and placing objects onto a flexible substrate after the FSA process has been applied to the substrate.

FIG. 16 relates to a method of picking and placing of objects onto a flexible substrate after the FSA process has been applied to the substrate. A slurry containing a plurality of objects is dispensed onto the substrate 90. The objects fall into recessed regions in the substrate. The excess slurry is collected and recycled 91. The substrate is checked for empty recessed regions 92. This checking is performed by an electronic eye that views the substrate. Objects are robotically placed into empty regions found in substrate 94. A metalization material is placed onto at least one of the substrate's surfaces and is patterned or etched 96. The display tape is coupled to the substrate 98.

Figure 17:
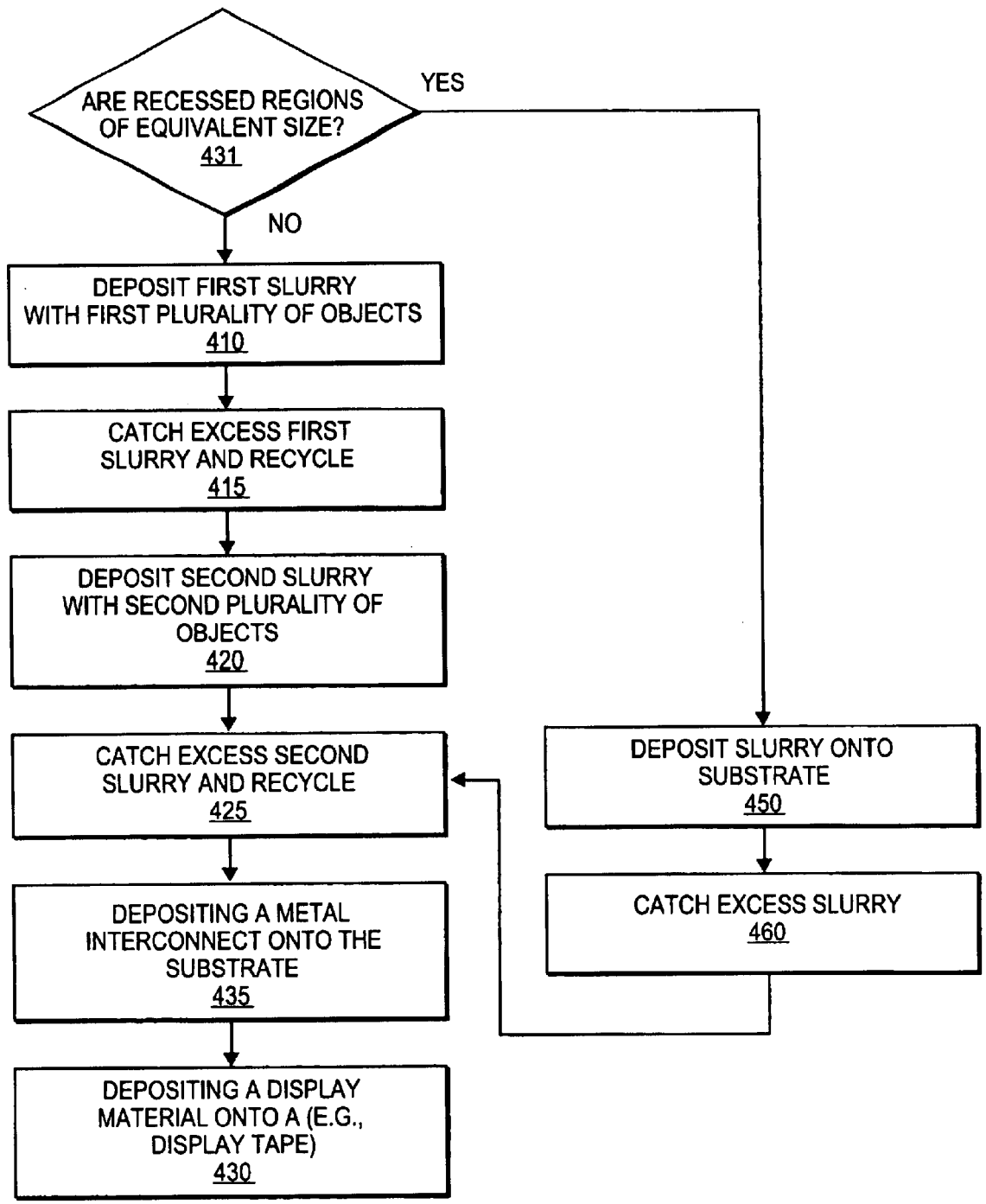
FIG. 17 shows a flow chart that relates to the FSA process and the coupling of the display material to the substrate.

FIG. 17 relates to the FSA process and the coupling of the display material with the substrate. First, a slurry containing a plurality of blocks is deposited onto the substrate 400. If the recessed regions are of equivalent size, step 450 is then followed. If not, a first slurry with a first plurality of objects is deposited onto the substrate 410. Excess slurry is caught and recycled 415. Once this step is performed, a second slurred with a second plurality of objects is placed onto the substrate 420. Excess second slurry is recycled into a second container 425. A metal interconnect is then deposited onto the substrate 435. After these steps, a display material is deposited onto the substrate 430.

Figure 18:
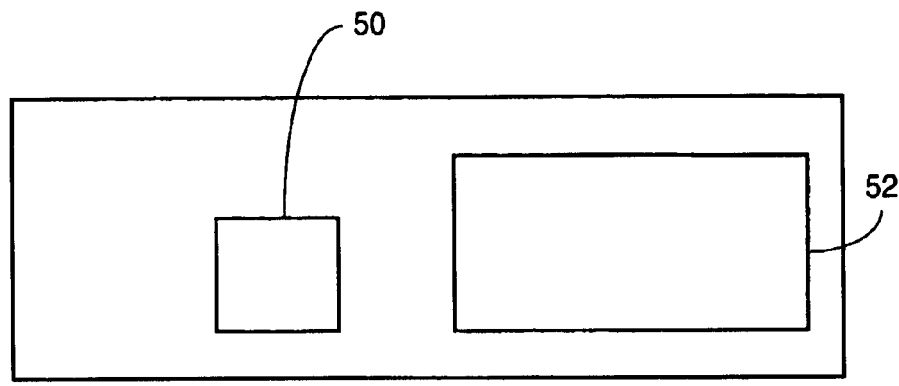
FIG. 18 shows a top view of a flexible continuous substrate wherein displays of different sizes are created.
Figure 19:
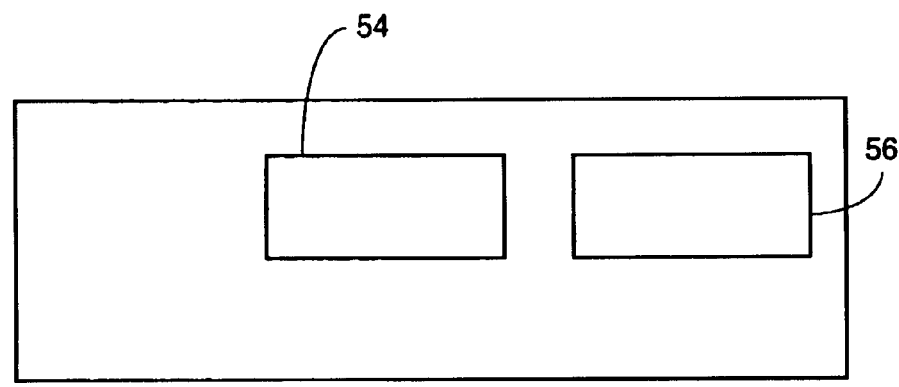
FIG. 19 shows a top view of a flexible continuous substrate wherein displays of similar size are created.

FIG. 18 shows a flexible continuous substrate wherein two displays are created. Display device 52 is larger than display device 50. This shows that multiple displays of different sizes can be created on the substrate through an in-line process. Alternatively, FIG. 19 shows displays 54 and 56 of similar size.

Figure 20:
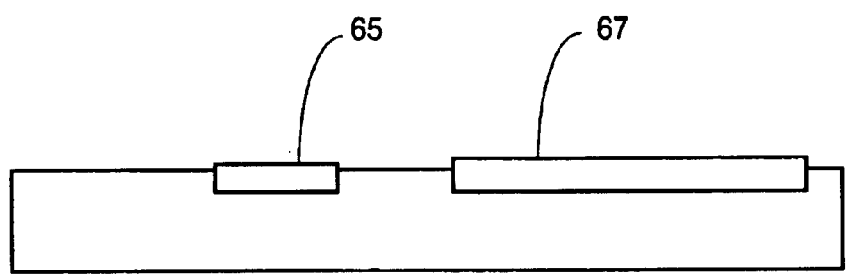
FIG. 20 shows a planar side view of the recessed regions in the substrate.

In addition to multiple displays being able to be made different sizes, the substrate itself may have different sized recessed regions. This allows the substrate to receive various sized blocks or devices. FIG. 20 shows a cross-sectional view of the recessed regions in the substrate. Recessed region 65 is smaller than recessed region 67.

Figure 21:
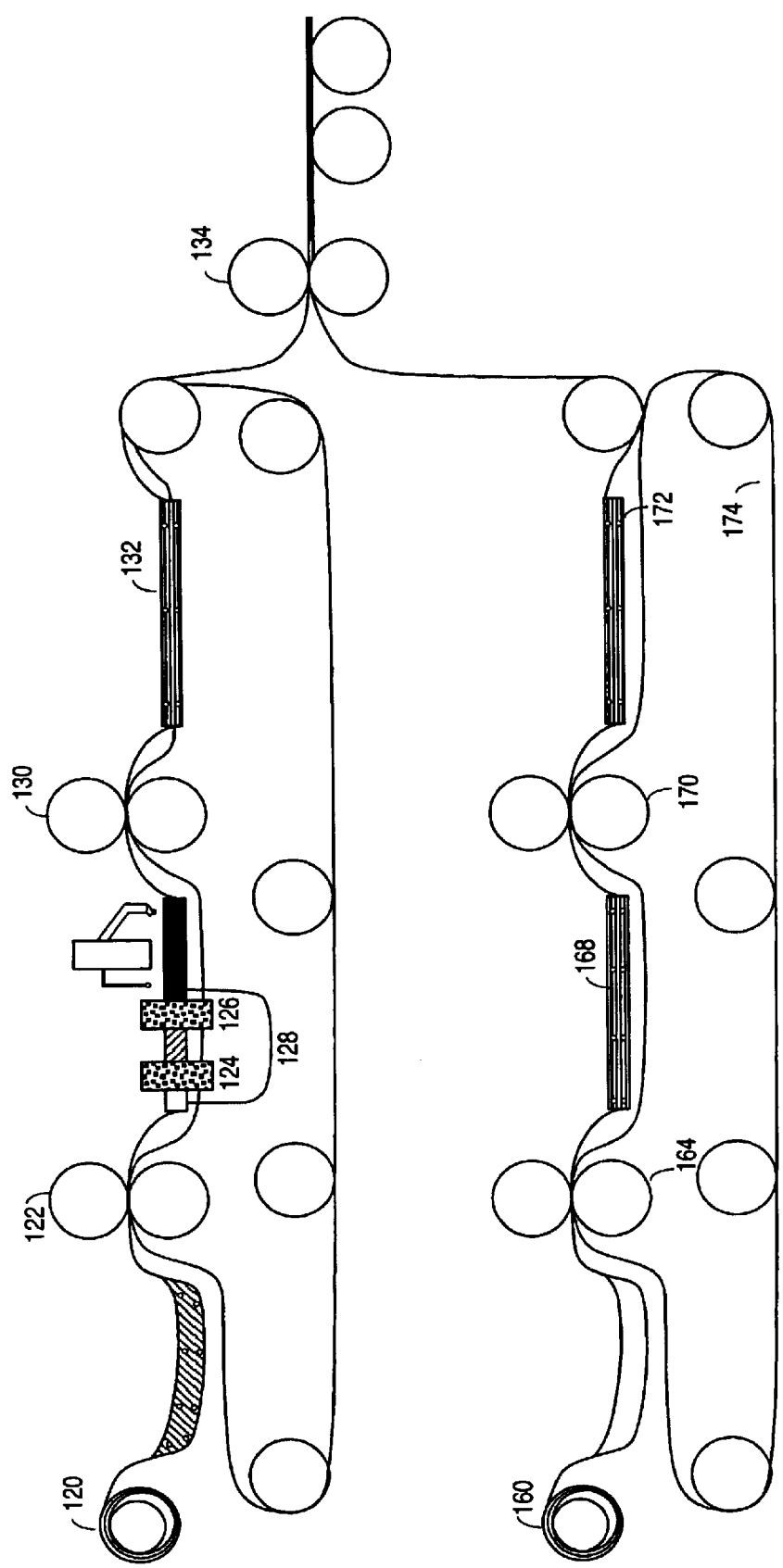
FIG. 21 shows an embodiment of the overall in-line process of the invention.

FIG. 21 shows an embodiment of the overall in-line process of the invention. A web apparatus machine 119 is used to process the substrate. At step 120, apertures are created in the flexible substrate. These apertures can be created by a number of methods. For example, the apertures can be punched into the substrate. Another method involves using a template to create the apertures. A laser, chemical or plasma etching could also be used to create the apertures. The substrate advances over a plurality of support members 122. The substrate goes in between support members 123 and 123B. The FSA process is applied to the substrate. FSA comprises a slurry that contains a plurality of functional blocks. These blocks have, in one embodiment, a circuit element (not shown) that drives the picture element (not shown). The FSA process occurs at block 124. It is then applied again at 126. The excess slurry is collected in container 128. Then, the flexible substrate advances through support members 130. The flexible substrate then has an interconnect 131 deposited on the top of the flexible substrate 132. The resulting flexible substrate advances over a guide member and meets at a point 134 wherein it is coupled to a display tape that in one embodiment is a flexible substrate that includes separate regions each having a display material on this flexible substrate. A different portion of the process involves the display tape 160. Before the display tape is coupled with the substrate, the display tape goes through its own separate process that is described below.

The display tape has display material 162 deposited on at least one side of the display tape. There are a variety of ways that display material may be deposited onto the display tape. For example, display material may be sprayed onto the display tape. The display material also may be placed on a screen over the display tape. Another method is to place the display tape into a container that holds the display material. The display tape advances through support members 164. The display tape then has display material layered or patterned on the display tape at 168. This display tape then advances through another plurality of support members 170. A large area metal interconnect is then deposited or etched onto the display tape 172. This may be performed by inkjet, lithography and etch, screen print, laser etch, or deposit 174. In one embodiment of the invention, this large interconnect is a cover glass electrode. At point 134, the display tape is coupled with a substrate.

Figure 22:
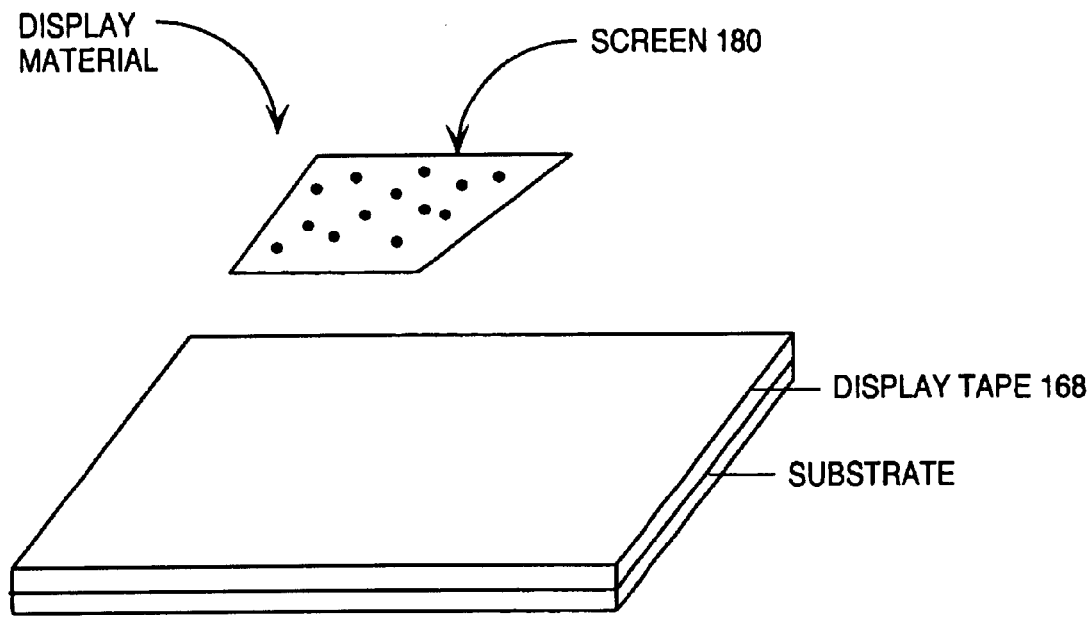
FIG. 22 shows a top view of display material being placed through a screen onto display tape

FIG. 22 shows a display material being placed through a screen 180 onto display tape 168. The screen 180 has a desired pattern created by holes that go through the screen 180. This desired pattern may be dictated by a customer or by the manufacturer.

Figure 23:
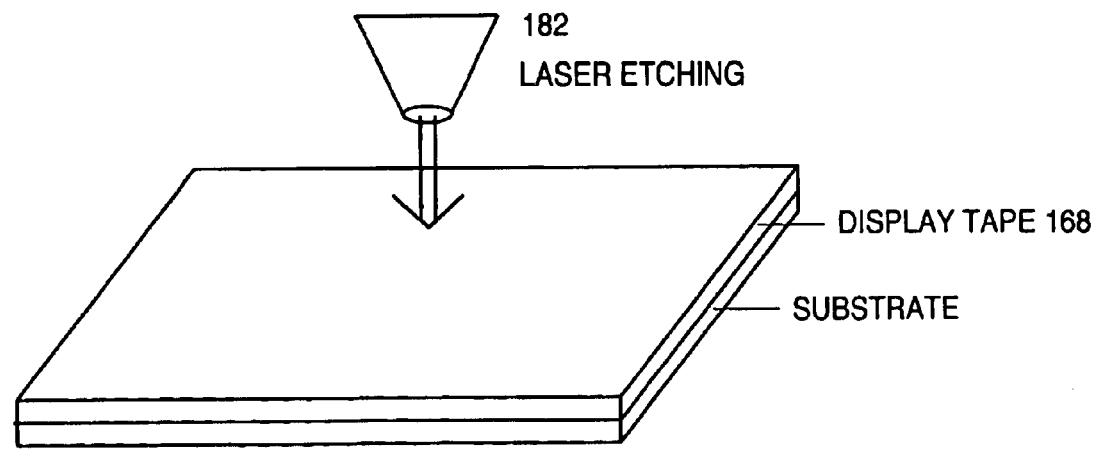
FIG. 23 shows a top view of display material being laser etched onto display tape.

Another method of placing display material onto the display tape is shown in FIG. 23. FIG. 23 shows a top view of display material being laser etched onto display tape 168. The etching occurs when the high intensity light from the laser 182 strikes the display material on top of the display tape 168. A pattern is created in the display material by the laser 182.

Figure 24:
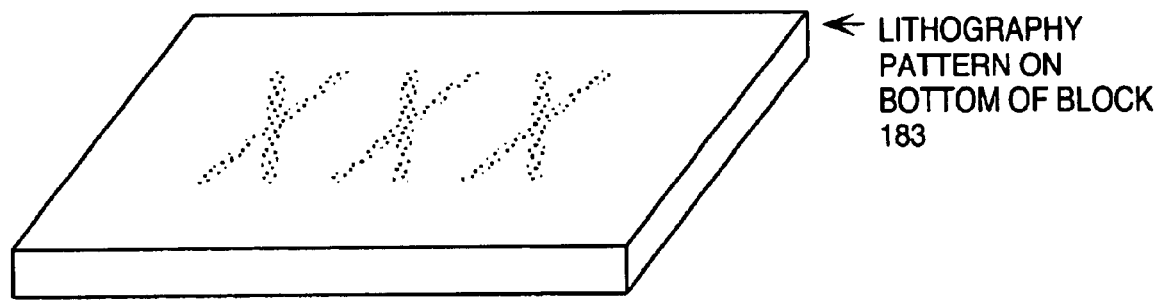
FIG. 24 shows a top view of display material wherein lithography is used to pattern the display material.

Another method of depositing display material is shown in FIG. 24. FIG. 24 shows lithography being used to pattern the display material. Lithography involves using a block 183 with a pattern engraved in the bottom surface of the block 183. The bottom surface of the block 183 contacts the display material.

Figure 25:
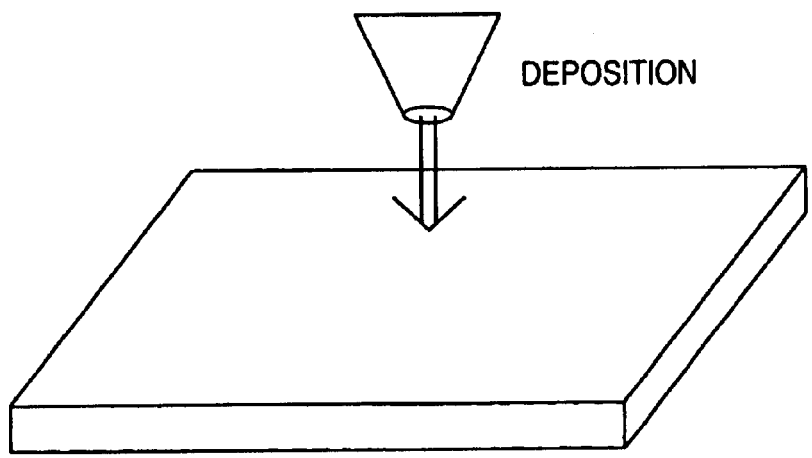
FIG. 25 shows a top view of display material that is deposited in a pattern onto display tape.

FIG. 25 shows yet another method of depositing display material onto the display tape. There display material is deposited in a pattern onto the display tape 168. The display material is deposited by a container 183 that contains the display material. The container 183 is placed over the display tape 168. The display material drops onto the display tape 168 in a pattern.

Figure 26A:
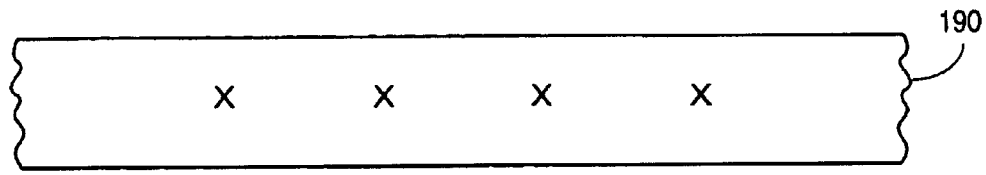
FIG. 26A shows a planar side view of a substrate.
Figure 26B:
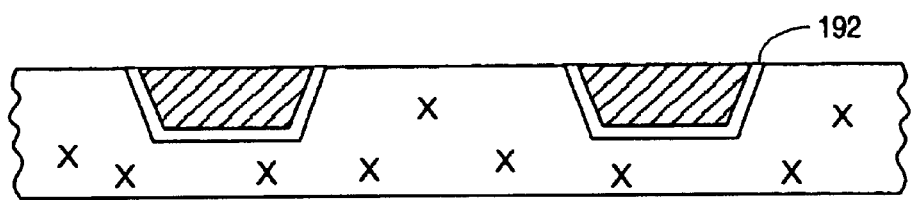
FIG. 26B shows openings or receptor regions created and blocks deposited into the substrate.
Figure 26C:
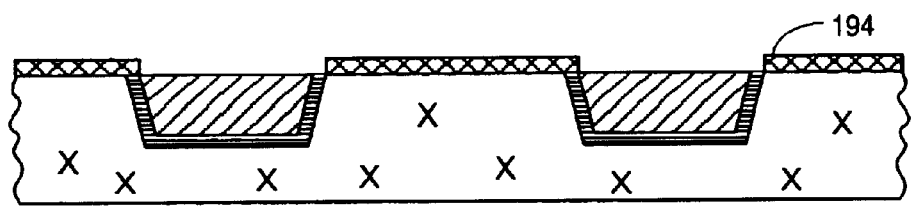
FIG. 26C shows deposition of planarization material and openings being created into the substrate.
Figure 26D:
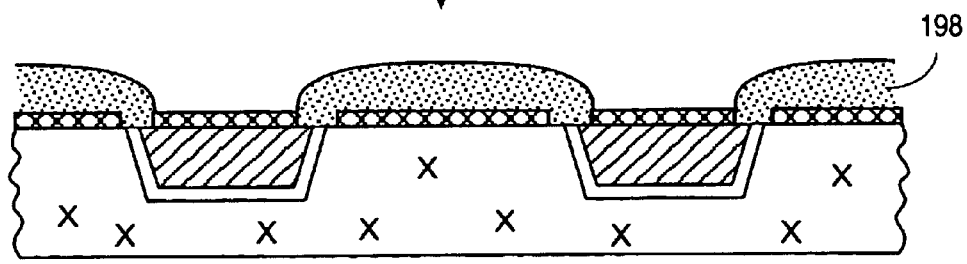
FIG. 26D shows deposition of interconnect and pattern interconnect.

FIGS. 26A–26D shows generally the process of planarization material being added onto the substrate. FIG. 26A shows a planar side view of a substrate 190. FIG. 26B shows openings or receptor regions 192 created and blocks deposited into the substrate. FIG. 26C shows deposition of planarization material 194 and openings being created into the substrate. FIG. 26D shows deposition of interconnect 198 and pattern interconnect.

While an array of components (e.g. display components) for an assembly have been described as examples of the invention, an array of other assemblies such as x-ray detectors, radar detectors, micro-electro-mechanical structural elements (MEMS) or, generally, an assembly of sensors or actuators or an assembly of circuit elements also may be produced using the claimed invention. Thus, for example, flexible antennas, other sensors, detectors, or an array of circuit elements may be fabricated using one of the embodiments of the inventions. Other aspects and methods of the present invention as well as apparatuses formed using these methods are described further below in conjunction with the following figures.

Listed below are related U.S. Patent Applications that describe various improvements to the methods and devices of the invention described herein. These patent applications are incorporated by reference. Additionally, a U.S. Patent is also incorporated by reference.

Co-pending U.S. patent application Ser. No. 09/270,157, entitled "Methods for Transferring Elements From A Template To A Substrate", filed by Jeffrey J. Jacobsen, Mark A. Hadley, and John Stephen Smith and assigned to the same Assignee of the present invention, describe an FSA on a template with transfer to another substrate. These co-pending applications are hereby incorporated herein by reference.

Co-pending U.S. patent application Ser. No. 09/270,159, entitled "Methods and Apparatuses for Fabricating A Multiple Module Assembly", filed by Jeffrey J. Jacobsen, Glenn Wilhelm Gengel, and Gordon S. W. Craig and assigned to the same Assignee as the present invention, describes an electronic modular assembly. This co-pending application is hereby incorporated herein by reference.

Co-pending U.S. patent application Ser. No. 09/270,147, entitled "Apparatuses and Methods Used in Forming Electronic Assemblies", filed by Jeffrey J. Jacobsen, Glenn Wilhelm Gengel, and John Stephen Smith and assigned to the same Assignee as the present invention, describes a method of molding substances. This co-pending application is hereby incorporated herein by reference.

Co-pending U.S. patent application Ser. No. 09/268,755, entitled "Web Process Interconnect in Electronic Assemblies", filed by Jeffrey J. Jacobsen, Glenn Wilhelm Gengel, Mark A. Hadley, Gordon S. W. Craig, and John Stephen Smith and assigned to the same Assignee as the present invention, describes a method of creating various interconnects on a web tape. This co-pending application is hereby incorporated herein by reference.

Co-pending U.S. patent application Ser. No. 09/270,165, entitled "Apparatuses and Methods for Forming Assemblies" (Docket No. 003424.P016), filed by Jeffrey J. Jacobsen and assigned to the same Assignee as the present invention, describes a method of rolling blocks into their recessed regions. This co-pending application is hereby incorporated herein by reference.

U.S. Pat. No. 5,545,291 entitled "Method for Fabricating Self-Assembling Microstructures," filed by John S. Smith and Hsi-Jen J. Yeh, issued Aug. 13, 1996.

In the preceding detailed description, the invention is described with reference to specific embodiments thereof. It will, however, be evident that various modifications and changes may be made thereto without departing from the broader spirit and scope of the invention as set forth in the claims. The specification and drawings are, accordingly, to be regarded in an illustrative rather than a restrictive sense.

What is claimed is:

1. A device for continuously feeding a flexible substrate and a display tape through a production line to form a display panel comprising:

a first drive belt disposed on a first plurality of support members to traverse a flexible substrate about a stationary point;

a second drive belt disposed on a second plurality of support members to traverse a display tape about the stationary point;

said flexible substrate disposed on a first drive belt wherein the flexible substrate has apertures;

a display tape deposited on the second drive belt wherein the display tape has apertures;

a slurry comprising a plurality of shaped blocks is placed onto the substrate;

a container stores excess slurry;

the first drive belt has adjustable fasteners corresponding to the apertures of the flexible substrate;

the second drive belt has adjustable fasteners corresponding to the apertures of the display tape; and the flexible substrate is coupled to the display tape.

2. The device of claim 1 wherein the flexible substrate is comprised of the material selected from the group consisting of glass, plastic, and silicon.

3. The device of claim 1 wherein the display tape is comprised of the material selected from the group consisting of polyether sulfone (PES), polyester terephthalate, polycarbonate, polybutylene terephthalate, polyphenylene sulfide (PPS), polypropylene, polyester, aramid, polyamide-imide (PAI), polyimide, aromatic polymides, polyethermide, metallic materials, acrylonitrile butadiene styrene, and polyvinyl chloride.

4. The device of claim 1 wherein said apertures of the substrate are about evenly spaced.

5. The device of claim 1 wherein said apertures of the display tape are about evenly spaced.

6. The device of claim 1 wherein the display tape has a top surface and a bottom surface and at least one of the top surface and bottom surface has a metalization film.

7. The device of claim 1 wherein the display tape is heated.

8. The device of claim 1 wherein the display tape is patterned.

* * * * *